*(12)* United States Patent
Parayandeh et al.

(10) Patent No.: US 7,652,604 B2
(45) Date of Patent: Jan. 26, 2010

(54) PROGRAMMABLE ANALOG-TO-DIGITAL CONVERTER FOR LOW-POWER DC-DC SMPS

(75) Inventors: Amir Parayandeh, North York (CA);
Aleksandar Prodic, Toronto (CA)

(73) Assignee: EXAR Corporation, Fremont, CA (US)

( * ) Notice: Subject to any disclaimer, the term of this patent is extended or adjusted under 35 U.S.C. 154(b) by 0 days.

(21) Appl. No.: 11/773,330

(22) Filed: Jul. 3, 2007

(65) Prior Publication Data
US 2008/0204290 A1 Aug. 28, 2008

Related U.S. Application Data

(60) Provisional application No. 60/892,109, filed on Feb. 28, 2007.

(51) Int. Cl.
*H03M 3/00* (2006.01)
(52) U.S. Cl. ........................ 341/143; 341/155
(58) Field of Classification Search .......... 341/143–155
See application file for complete search history.

(56) References Cited

U.S. PATENT DOCUMENTS

| | | | | |
|---|---|---|---|---|
| 4,866,442 | A * | 9/1989 | Steim et al. ................. | 341/143 |
| 5,867,693 | A * | 2/1999 | Wang et al. ................. | 713/500 |
| 6,356,132 | B1 * | 3/2002 | Mastrocola et al. ......... | 327/276 |
| 6,587,811 | B2 * | 7/2003 | Schleifer et al. ............ | 702/176 |
| 6,933,709 | B2 * | 8/2005 | Chapuis ...................... | 323/282 |
| 7,034,721 | B2 * | 4/2006 | Lee ............................. | 341/118 |
| 7,068,206 | B2 * | 6/2006 | Augusto et al. ............. | 341/172 |
| 7,342,528 | B2 * | 3/2008 | Ng et al. ..................... | 341/153 |
| 2005/0278044 | A1 * | 12/2005 | Chen et al. .................. | 700/94 |
| 2005/0287964 | A1 * | 12/2005 | Tanaka et al. ............... | 455/118 |

OTHER PUBLICATIONS

Rahman, "Multimode Digital SMPS Controller IC for Low-Power Management", Circuits and Systems, May 21, 2006, pp. 5327-5330, ISCAS 2006, IEEE International Symposium.
Kim, et al., "A Time-Based Analog-to-Digital Converter Using a Multi-Phase Voltage-Controlled Oscillator", Circuits and Systems, May 21, 2006, pp. 3934-3937, ISCAS 2006, IEEE International Symposium.
Parayandeh, et al., "Programmable Digital Controller for Multi-Output DC-DC Converters with a Time-Shared Inductor", Power Electronics Specialists Conference, Jun. 18-22, 2006, 5 pages.
Zhang, et al., "A Digital Multi-Mode Multi-Phase IC Controller for Voltage Regulator Application", Applied Power Electronics Conference, Feb. 25, 2007, 5 pages.
International Search Report for PCT/US2008/069216, dated Dec. 5, 2008, 10 pages.

* cited by examiner

*Primary Examiner*—Lam T Mai
(74) *Attorney, Agent, or Firm*—Fliesler Meyer LLP (57) ABSTRACT

A voltage-to-time based windowed analog-to-digital converter (ADC) can have programmable reference voltage, conversion time, and accuracy of voltage regulation. The ADC can be fully implemented on a small silicon area and is suitable for implementation in various integrated digital controllers for high-frequency low-power switch-mode power supplies (SMPS). The programmable characteristics can be achieved through the utilization of the inherent averaging effect of the delay line or of the other voltage-to-time conversion structures and through the adjustments of delay cells' propagation times or the effective voltage-to-time conversion ratio in alternative structures.

20 Claims, 7 Drawing Sheets

PROGRAMMABLE ANALOG-TO-DIGITAL CONVERTER FOR LOW-POWER DC-DC SMPS

CROSS-REFERENCE TO RELATED APPLICATIONS

This application is related to the following co-pending application: U.S. Patent Application entitled "UNIVERSAL AND FAULT-TOLERANT MULTIPHASE DIGITAL PWM CONTROLLER FOR HIGH-FREQUENCY DC-DC CONVERTERS", U.S. Patent Application No 60/892,109, by Aleksandar Prodić et al., filed Feb. 28, 2007.

BACKGROUND OF INVENTION

Digital controllers that can be fully implemented in CMOS IC processes and have programmable parameters, such as switching frequency, voltage reference, and the accuracy of its regulation, can bring numerous advantages in low-power SMPS. In cell-phones, personal data assistants (PDA), and other portable devices, they can significantly reduce the overall system size, increase reliability, as well as battery operating time. To provide regulated voltages for various functional blocks, which in most of the cases are based on digital components, multiple application specific analog controller ICs are predominant. As a result, the systems often have a sub-optimal size and number of components. If implemented in the same CMOS process as their predominantly digital loads, the programmable controllers can be easily integrated on the same silicon die and programmed to satisfy specific power supply requirements. In addition to the resulting size reduction, they can provide design portability and can practically eliminate the time-consuming analog redesign, required each time the IC implementation technology and, hence, supply voltage requirements change.

Programmable controllers can simplify implementation of power savings techniques based on dynamic voltage scaling (DVS) where the supply voltage is changed in accordance with the processing load. They can eliminate the need for interconnecting circuits and improve communication between the power supply and its digital load.

DETAILED DESCRIPTION OF INVENTION

Figure 1:
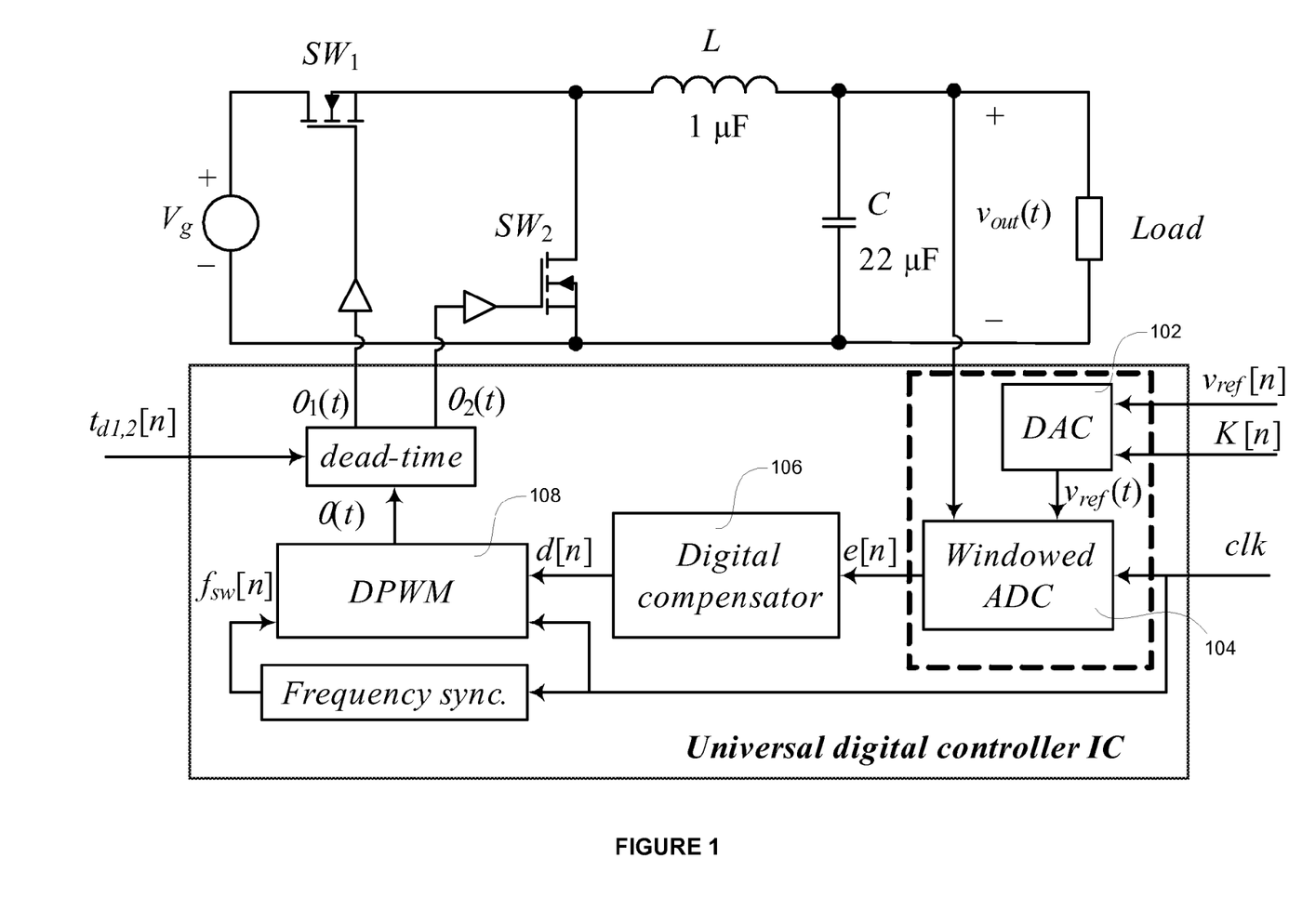
FIG. 1 shows an exemplary digital-to-analog converter.

FIG. 1 shows an exemplary digital-to-analog converter (DAC) 102 that provides programmable reference voltage $v_{ref}(t)$, a windowed ADC 104 for the conversion of output voltage error into its digital equivalent e[n], a compensator 106 that based on e[n] creates a duty-ratio control signal d[n], and a digital pulse-width modulator (DPWM) 108, capable of operating at programmable switching frequencies.

From a practical point of view the implementation of structure of FIG. 1 is quite challenging and a naive implementation often results in sub-optimal system characteristics. Compared to most of the existing digital solutions, analog controllers still have significant advantages in terms of power consumption and silicon area required for implementation, which are among the most important IC parameters in low-power applications. Hence, they are still preferred options in most modern portable devices.

Most prior high-frequency digital controllers are designed to regulate voltage in a narrow range around fixed analog reference only and do not allow full utilization of digital control advantages. This is because power and area efficient windowed-based ADC architectures are commonly used. They are an effective alternative to full-range ADCs, whose complexity significantly exceeds that of a whole analog controller. Solutions consisting of a windowed-based ADC and a conventional DAC for reference adjustment do not result in optimal architectures either, and, in some cases, are not even feasible in up to date IC technologies. Current-source, switch-capacitor and resistive network based DACs often require analog blocks whose supply voltages exceed the maximum allowable value of the digital circuits implemented in the latest CMOS processes. On the other hand, fully-digital sigma-delta modulator based architectures require a large RC filter, which cannot be simply implemented on a chip without taking a huge amount of silicon area and/or power.

As described below, a new low-power ADC architecture can have programmable reference voltage and can be implemented on a small chip area. The ADC's conversion time and the accuracy of the output voltage regulation can also be programmed. These features allow programmable digital controllers to have silicon area and power consumption comparable to analog systems while allowing better utilization of digital control advantages.

Figure 2:
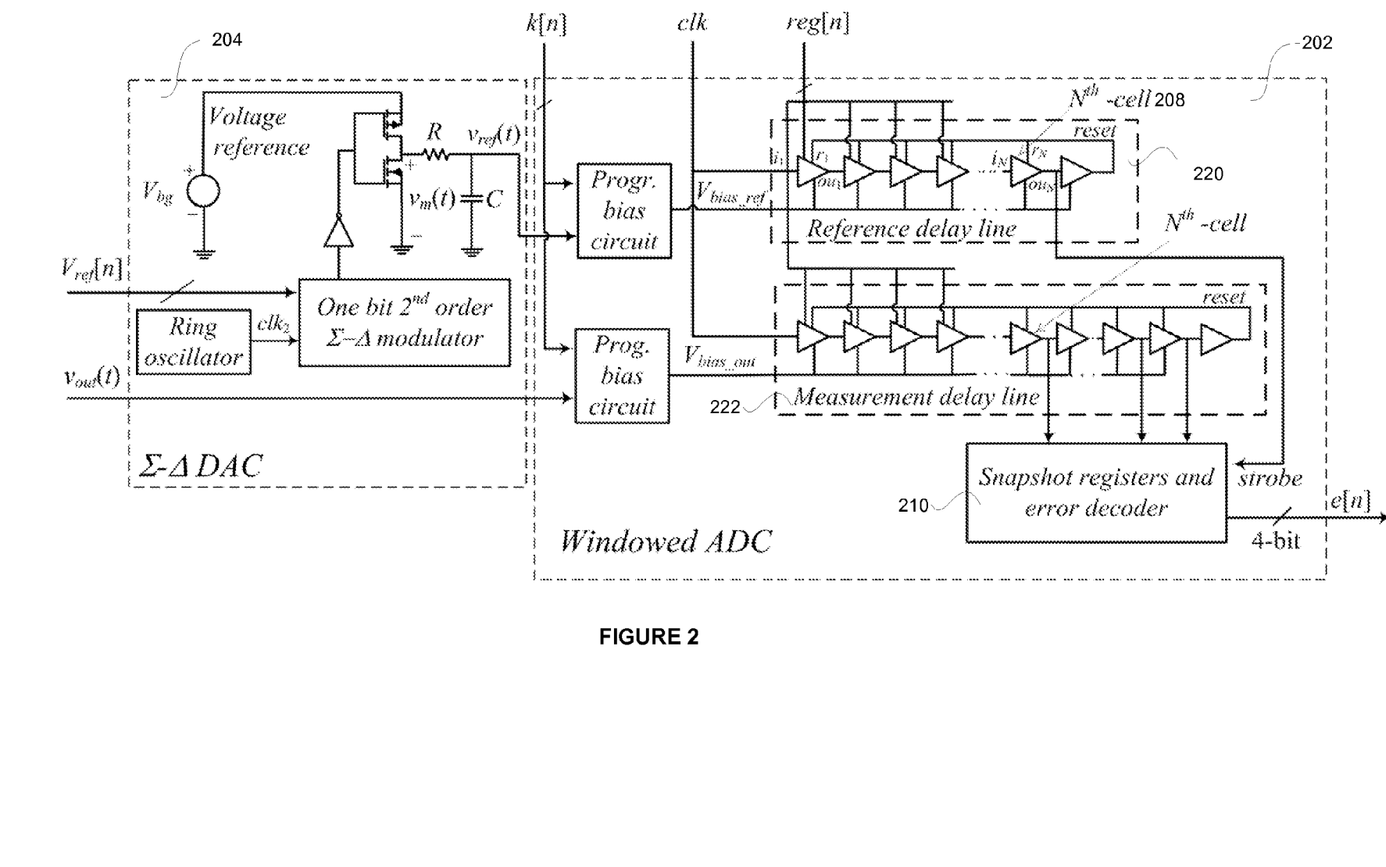
FIG. 2 shows a programmable analog-to-digital converter.

One embodiment of the present invention includes a sigma-delta DAC 204 that receives a digital value and outputs an analog output whose average is related to the digital values. A windowed ADC converter 202 can include a reference delay line 220 that is adjusted using an output of the sigma-delta DAC 204 and a measurement delay line 222 that is adjusted using an output voltage wherein the windowed ADC converter 202 determines an error value. The delay lines can act as a moving average filter. Alternatively, instead of delay lines ring oscillators, voltage controlled oscillators or any other voltage-to-time converter having inherent averaging effect can be used. In that case, the structure would consist of two voltage-to-time converters, first for the output voltage conversion and the second for the transfer of the reference value into its digital equivalent.

The sigma-delta DAC can include a RC filter. The RC filter can be selected to be relatively close to the moving average filter effect of the windowed ADC.

The error can indicate the difference of the output voltage from a digital reference value. The digital value sent to the sigma-delta DAC can be the lower bit or bits of the digital reference value. The difference in the number of delay cells in the reference delay line and measurement delay line through which a clock passes can be used to determine the error. In the implementations based on other voltage-to-time converters the difference in digital outputs of the reference and measurement line can be used for error measurement.

Some of delay cells can be programmable to have a programmable delay that is a selectable multiple of the delay of the other delay cells. The selectable delays can be integer multiples. The integer multiple can be selectable to be an integer from 1 to $2^k$. The total delay of the reference delay line can be selectable over a range of values greater than the number of delay cells.

One embodiment of the present invention is a circuit comprising: a reference delay line including a number of delay cells; a measurement delay line can include delay cells. The measurement delay line can be strobed by an output of the reference delay line. Some of the delay cells of the reference delay line and measurement delay line can be programmable delay cells. The delay of the programmable delay cells can be programmable to have a delay that is on a multiple of the other delay cells. One embodiment of the present invention is a circuit comprising: a sigma-delta unit; and a second unit connected to the output of the sigma-delta unit. The second unit including a reference delay line and measurement delay line wherein the second unit can act as a low pass filter for the output and the sigma-delta unit.

The programmable ADC, shown in FIG. 2, can consist of two main blocks, a delay-line based windowed ADC 202 with digitally programmable quantization steps and a sigma-delta ($\Sigma$-$\Delta$) DAC 204 that sets reference $v_{ref}(t)$ proportional to the $N_{ref}$-bit digital input $V_{ref}[n]$.

The single-bit $2^{nd}$ order sigma-delta ($\Sigma$-$\Delta$) modulator, transistors, and voltage reference (band gap) $V_{bg}$ of the DAC can be used to create a pulse-density modulated (PDM) signal $v_m(t)$ whose average value is $V_{bg}V_{ref}[n]/(2^{Nref}-1)$ and the carrier frequency equal to that of internal clock $clk_2$.

To extract the dc value of the PDM signal, in this architecture, instead of a large RC circuit a two stage low-pass filter can be used. The PDM signal is first passed to a small RC circuit, and then further filtered out through the natural averaging effect of the ADC's reference delay line. As a result, implementation of the full structure on a small silicon area can be made possible.

More detailed explanation of this averaging effect of the delay lines, which can be applied for other voltage-to-time converters, can be given through the following analysis of the ADC's operation. The ADC of FIG. 2 can be a modified version of the architecture presented in the patent application entitled "Universal and Fault-Tolerant Multiphase Digital PWM Controller for High-Frequency DC-DC Converters", inventors Prodic, et al., filed Feb. 28, 2007, Ser. No. 60/892,109 which is incorporated herein by reference. This embodiment consists of two delay lines having identical current-starved delay cells but different numbers of them, two programmable bias circuits, a snapshot register, and an error decoder. The first, reference delay line can have N+1 cells whose propagation time is controlled by the reference voltage $v_{ref}(t)$ through a bias circuit. The bias circuit can be used as a digitally programmable voltage-to-current converter that regulates conversion time. The second delay line can have N+M delay cells and propagation time inversely proportional to the power stage's output voltage $v_{out}(t)$.

At the beginning of each switching interval a clk signal can simultaneously send two pulses through the delay lines. When the pulse propagating through the reference delay line reaches the $N^{th}$ cell 208, a strobe signal can be created and the state of the measurement delay line can be captured by the snapshot register 210. If the number of cells the signal has propagated through is smaller than N the output voltage is lower than $v_{ref}(t)$ and positive error e[n], proportional to the difference in the number of cells is created by the error decoder. Similarly, the propagation through a larger number of cells indicates higher output voltage resulting in a negative error. The $(N+1)^{th}$ cell of the reference line is used to reset all the cells before the next clk pulse arrives.

Figure 3:
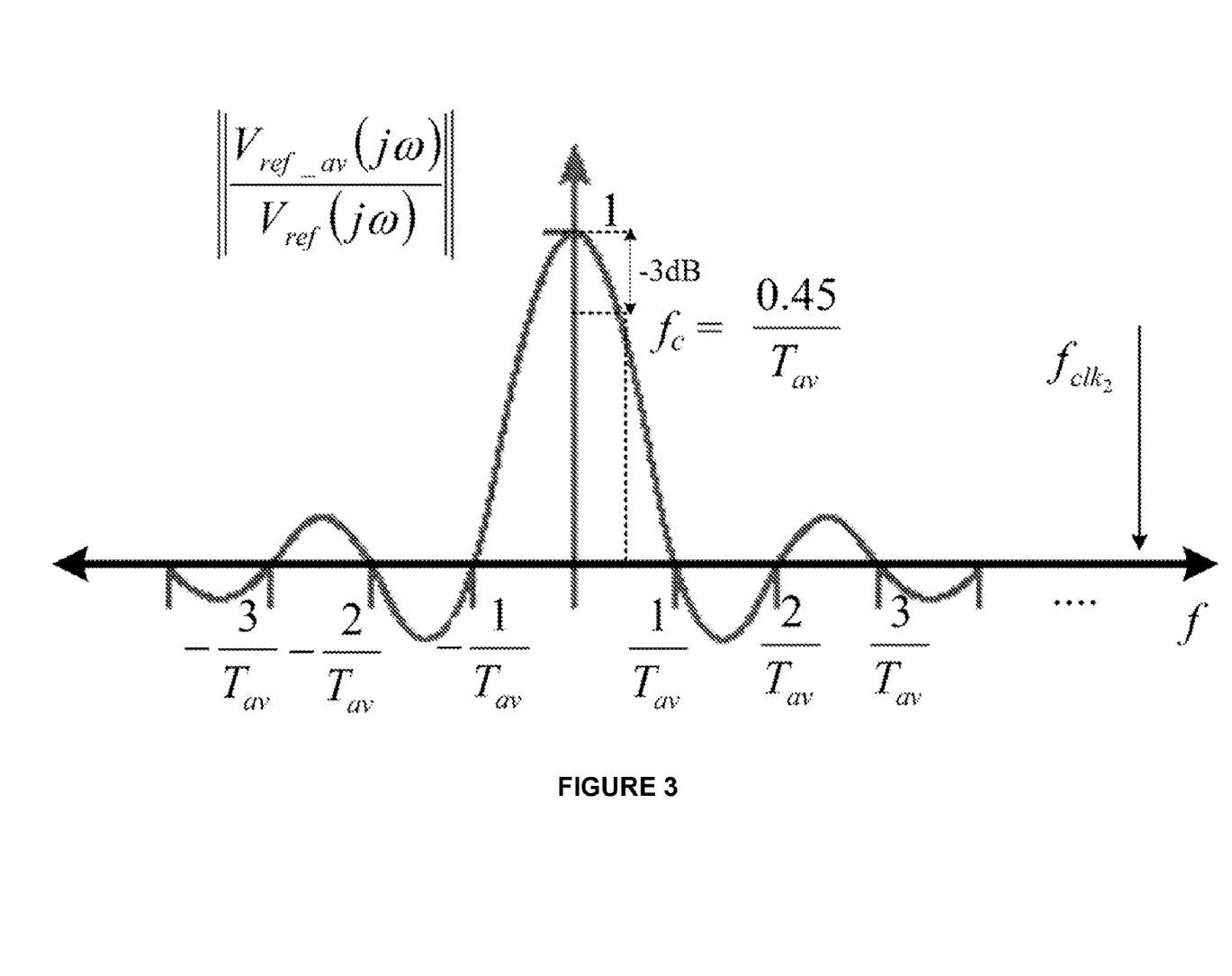
FIG. 3 shows a graph of the magnitude characteristics of a delay line.

This ADC can measure the difference in the average values of $v_{ref}(t)$ and $v_{out}(t)$ over the conversion period $T_{av}=Nt_{d1}$, where $t_{d1}$ is the propagation time through a reference delay cell. It behaves as a moving average filter, whose transfer function can be described with the following equation and the diagram plotted in FIG. 3.

$$V_{ref\_av}(j\omega) = V_{ref}(j\omega) \cdot \text{sinc}\frac{\omega T_{av}}{2\pi} \cdot e^{-j\omega \frac{T_{av}}{2}} \quad (1)$$

As described earlier, this averaging effect can hugely reduces the size of RC filter and allows on-chip implementation of the DAC. Practically, it would be possible to completely eliminate the passive filter by increasing the $clk_2$ frequency or propagation times of delay cells. However, this would come at the price of increased power consumption and/or a slower conversion time of the ADC. Hence, a small RC filter, which gives good overall system's performance, is kept in. It should be noted that the averaging effect can be used with ADC architectures based on ring oscillator and counters as well.

In this subsection we describe the advantages of programmable voltage regulation, address regulation problems of conventional delay-line based architectures, and show a design modification that provides solutions for both of them.

In digitally controlled SMPS the accuracy of the output voltage regulation can be defined as $V_{q0}(2V_{ref})$, where $V_{q0}$ is the size of the ADC's quantization step around voltage reference $V_{ref}$, i.e. the width of the zero error bin, when assuming that the steady state value lies right at the middle of the bin. If an overly conservative requirement for the output voltage regulation, i.e. $V_{q0}$, is set, undesirable limit cycle oscillations (LCO) can occur and, consequently, the size and power consumption of the whole digital controller can significantly increase. This is because; no-LCO conditions require the DPWM resolution to increase as well. In most of the existing DPWMs improved resolution comes at the price of exponential increase in power consumption and/or silicon area. Hence, a universal ADC whose accuracy of the output voltage regulation can be programmed depending on design requirements can result in design optimization.

To find the accuracy of voltage regulation for the system of FIG. 2, dependence of e[n] on output voltage deviations is observed. First, we adopt approximation that the propagation times of a reference and a measurement delay cells around a certain operating point are $t_{d1} \approx k/V_{ref}$ and $t_{d2} \approx k/V_{out}$, respectively, where k is a parameter depending on the cells structure, operating point, and, in some cases ambient temperature. Then e[n], which as mentioned earlier, is equal to the difference in the number of cells the signals passing through delay lines have propagated through over the period $Nt_{d1}$, can be expressed as:

$$e[n] = N - N_m = N - \frac{Nt_{d1}}{t_{d2}} = N\left(1 - \frac{V_{out}}{V_{ref}}\right) \quad (2)$$

where $N_m$ it the captured state of the measurement delay line.

Next, let us assume that the output voltage was at the middle of the ADC's zero error bin and that a minimum variation of $v_{out}(t)$, causing e[n]=−1 has occurred, i.e. $V_{out}=V_{ref}+V_{q0}/2$. Then (2) becomes $$1 = N\frac{V_{q0}}{2V_{ref}} \quad (3)$$

This equation shows an interesting result that, for the ADC of FIG. 2, the quantization step does not depend on the structure of the delay cells but on their number only. In other words, the accuracy of regulation, $V_{q0}/(2V_{ref})$, is defined by the ratio of time step around the $N^{th}$ measurement cell and the total propagation time through the reference line. It also shows that in conventional delay-line structures a large number of cells is needed for tight voltage regulation. For example, to obtain +/−0.2%, regulation, at least 500 identical cells occupying large silicon area for the reference line only would be needed.

To minimize the area and allow digital adjustment of the voltage regulation, in the modification we introduce here, two types of delay cells are used. The exemplary ADC is designed to operate in −4<e[n] <4 range and first N−4 cells of both delay lines are made to have r times larger delay then the remaining ones, where the value r is controlled by a 2-bit digital signal reg[n]. As a result, the ratio of propagation times through the $N^{th}$ cell and the reference line becomes smaller improving regulation. For this case, (3) can be rearranged to obtain the following expression for the voltage regulation accuracy:

$$\frac{1}{r(N-4)+4} = \frac{V_{q0}}{2V_{ref}}. \qquad (4)$$

In the realization based on other types of voltage-to-time converters the similar effect can be achieved by dynamically changing the ratio of voltage-to-time conversion. It can be done by using a ring oscillator structure and programmable delay cells, for example.

This ADC architecture can rely on logic gates and current-starved delay cells. The current-starved cells can be chosen due to their simplicity and the possibility of implementation in the latest CMOS processes. They have a structure similar to digital logic, and unlike most existing analog circuits, can operate at low voltages used in modern digital systems. On the other hand, compared to digital gates, which are also used as delay cells, the current-starved structure has much more predictable and controllable delay, due to lower susceptibility on temperature variations.

Figure 4:
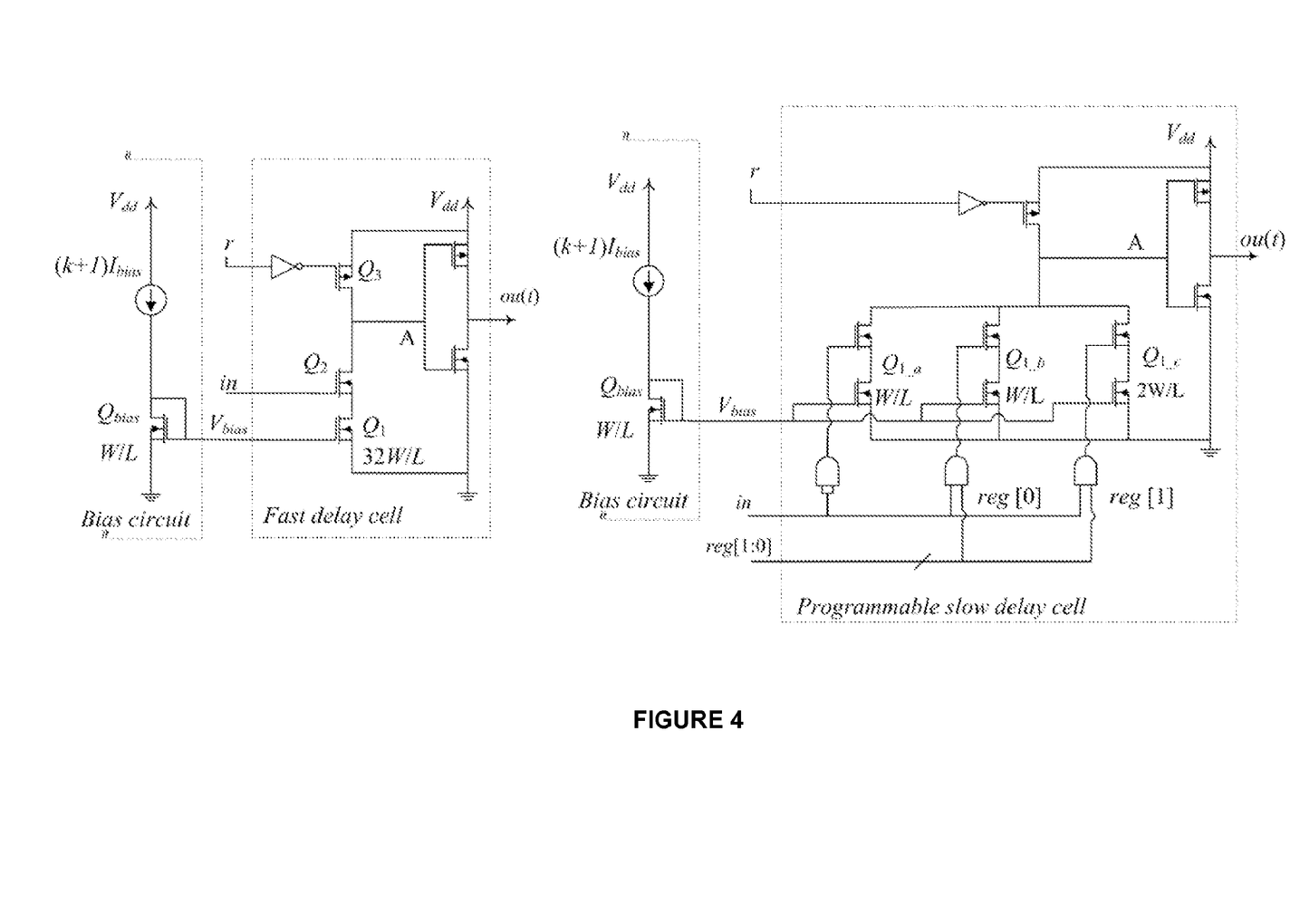
FIG. 4 shows exemplary fast and slow programmable current-starved delay cells.

In this exemplary design sixteen (16) slow cells in both delay lines are used. They can have a digitally programmable propagation time, up to 8 times longer than that of the fast cells. FIG. 4 shows the transistor level schematics of the fast and slow cells of one exemplary embodiment other designs can also be used. The fast cell has conventional current starved architecture. Its propagation time depends on the current discharging equivalent capacitance seen at the node A. This discharge can be controlled by $Q_1$ that behaves as a bias-circuit-controlled current source. The transistor $Q_2$ operates as a switch that, at the instance when the cell is triggered, passes the current through $Q_1$. The transistor $Q_3$, also operating as a switch, can be used to reset the cell. Its current quickly charges the node A to $V_{dd}$, when the reset signal r occurs. The slow delay works on the same principle. The main difference is that, in this case, the discharge current is much smaller, and can be digitally programmed by enabling/disabling current through differently sized transistors $Q_{1\_a}$ to $Q_{1\_d}$. The 2-bit binary delay control input reg[n] can set discharge current to be 1/32, 2/32, 3/32 or 4/32 times smaller than that of the faster cell. The selected number of delay cells and current ratio values can approximately correspond to the voltage regulations of +/−0.2%, +/−0.4%, and +/−0.8% respectively. A simple size comparison shows that, for the most accurate voltage regulation, this modification requires about 25 times smaller silicon area than the conventional delay line ADC requiring 500 fast delay cells for the reference line.

Figure 5:
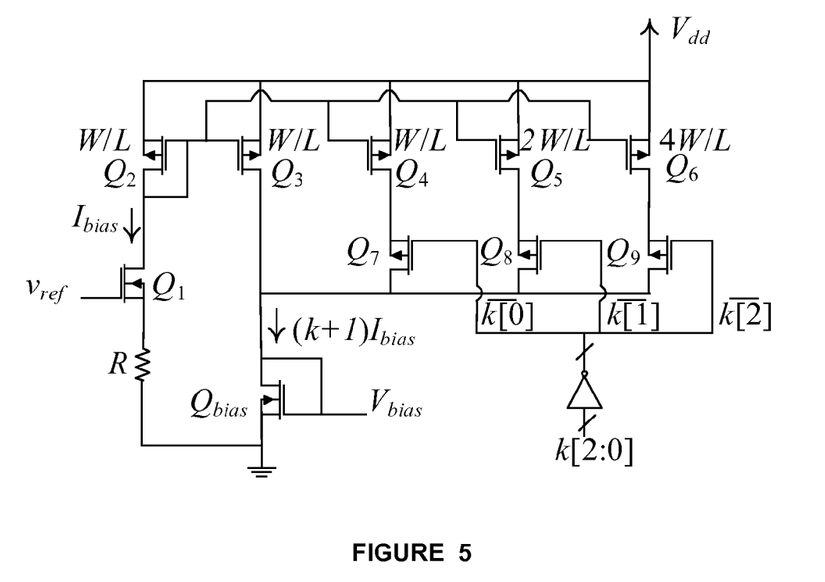
FIG. 5 shows a digitally programmable bias circuit.

Even though the accuracy of regulation is independent on the propagation time of delay cells the ADC's power consumption, conversion time and, consequently, filtering properties are not. To allow further controller optimization and reduce power consumption when a fast conversion is not required, the digitally programmable bias circuit of FIG. 5 can be implemented. The current through the transistor $Q_{bias}$, $(k[n]+1)I_{bias}$ and consequently $V_{bias}$ are controlled with the 3-bit input k[n]. By turning on and off switches $Q_7$ to $Q_9$, k[n] changes the currents produced by logarithmically sized current mirror transistors $Q_5$ to $Q_7$. As a result, $V_{bias}$ and the ADC conversion time change as well. Similarly, in voltage-controlled oscillator based architectures (i.e. voltage to time converters) the tradeoffs between conversion time and power consumption can be controlled by changing the frequency of the oscillator, while keeping the number of the cycles it goes through constant. Again, it can be easily done through variation of the delay cells propagation times.

C. Σ-Δ DAC

The DAC of FIG. 2 can implemented using a $2^{nd}$ order one-bit digital sigma-delta (Σ-Δ) modulator. In this application, it is preferred to the $1^{st}$ order Σ-Δ solutions. For the same clock frequency the $2^{nd}$ order modulator requires a smaller RC filter and minimizes possible low frequency tones, characteristic for the $1^{st}$ order systems. The DAC can be clocked with an internal ring oscillator operating at 80 MHz. Even though the clock frequency is relatively high, as shown in the following section, the modulator's power consumption is modest. This is because of its simple structure requiring a small number of active logic gates burning the power.

Figure 6:
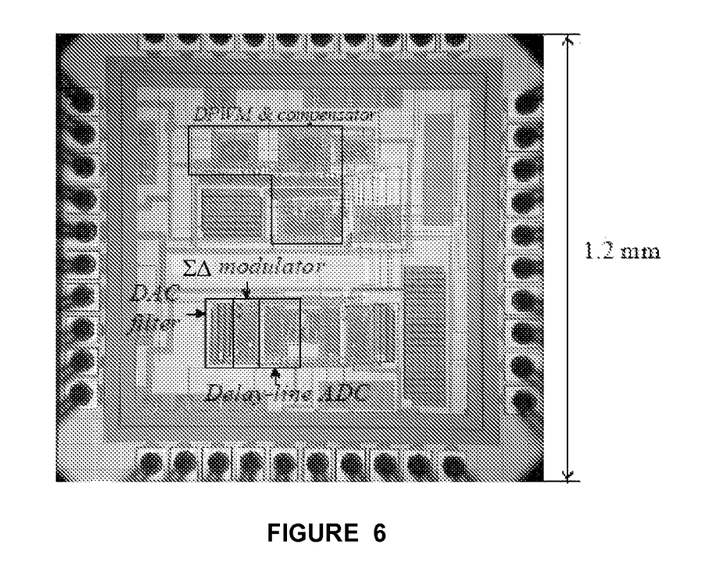
FIG. 6 shows a diagram of an exemplary chip of one embodiment.

The architectures of FIGS. 2 and 3 were implemented on an experimental digital controller IC, whose block diagram is shown in FIG. 1. The IC was realized in a standard 0.18 µm process and its DPWM and compensator are designed as a single-phase version of the multi-phase architecture. The IC was tested with an experimental 1 W, 1.5 MHz buck converter with 5 V input and a programmable output between 1 V and 3.3 V. A photograph of the chip and its main characteristic shown in FIG. 6 and Table I verify that the new ADC architecture has low power consumption of 53 µA/MHz for 150 ns conversion time and occupies a very small silicon area of 0.029 mm². The ADC has an external reference; however a band-gap taking insignificant power and area can be designed in new technologies.

Figure 7:
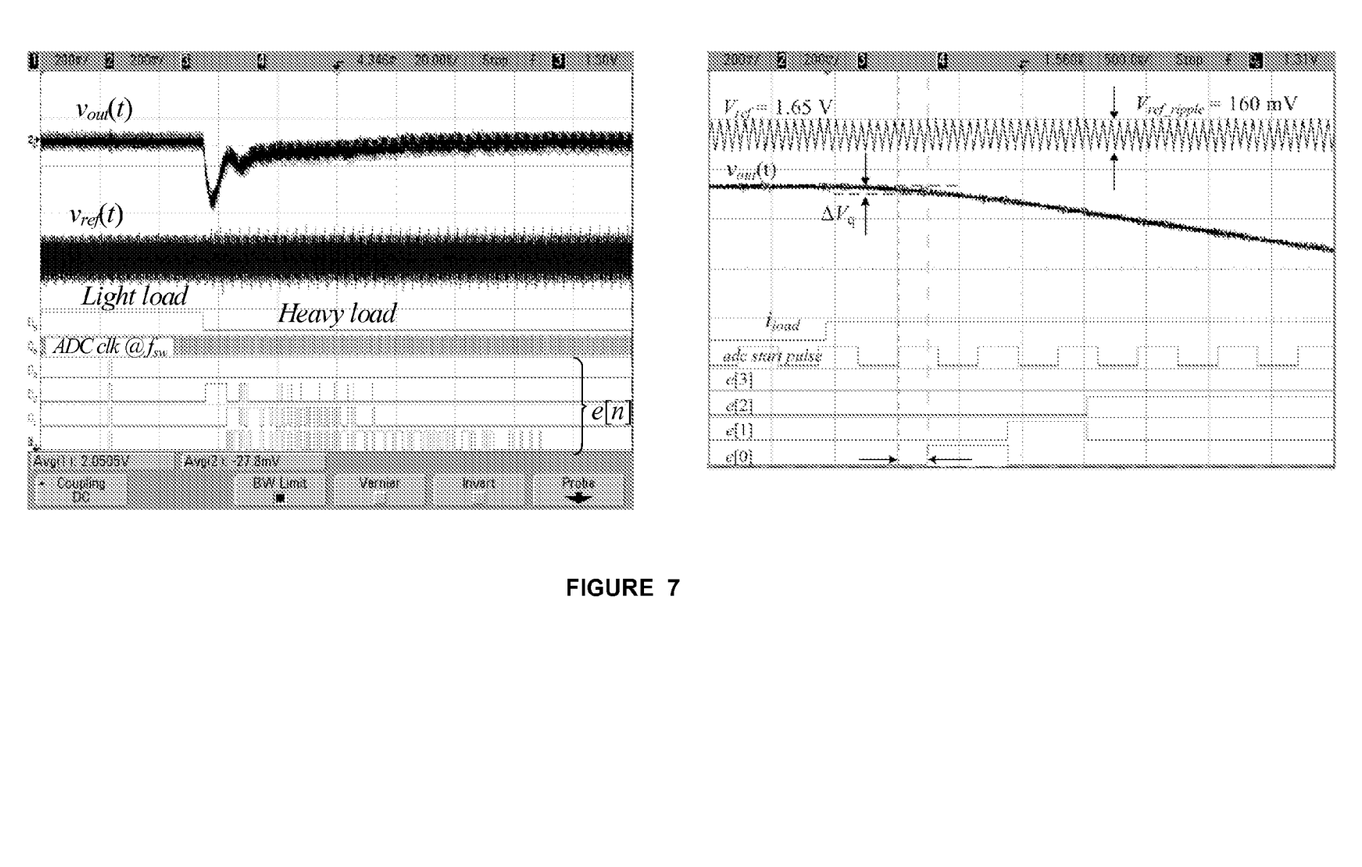
FIGS. 7-9 shows the operation of the chip of FIG. 6.
Figure 8:
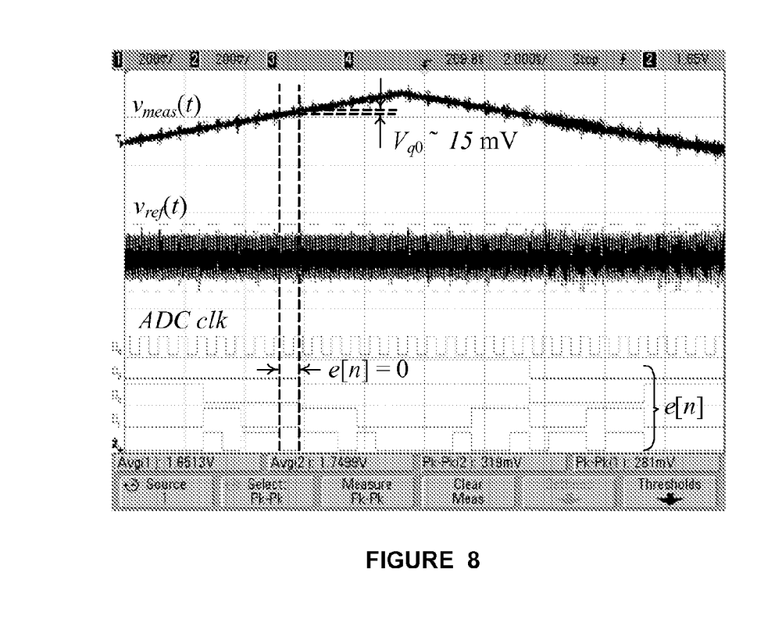
Figure 9:
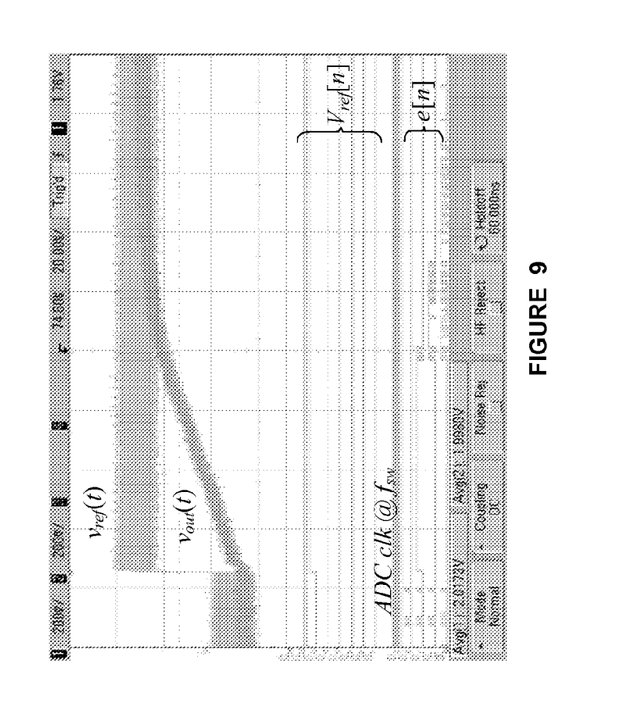

The results of FIG. 7, showing closed loop operation of the buck converter for two load transients, demonstrate fast conversion of the ADC and the filtering effect of its delay line. It can be seen that in steady state the output voltage error is zero, even though, the filter capacitor ripple is as high as 160 mV. The results also show that the ADC reacts fast to the output voltage changes and completes conversion in less than 200 ns after the clock signal occurs. FIG. 8 shows stand alone operation of the ADC with a triangular input $v_{meas}(t)$ whose amplitude is similar to that of the filter capacitor ripple and the frequency is lower. A high sensitivity to this input signal that provides tight output voltage regulation can be seen. FIG. 9 verifies functionality of the Σ-Δ DAC. It shows operation of the SMPS when the reference changes. The DAC changes $V_{ref}$ in a few µs allowing the ADC's use in systems where a quick change of the reference is required, like predictive DVS.

| | |
|---|---|
| Conversion time | Programmable ≧ 150 ns |
| Input voltage range | 1 V to 3.3 V |
| Power consumption | ADC: 28 µA/MHz; DAC: 25 µA/MHz |
| Voltage regulation | Programmable ≧ +/−0.2% |
| ADC area | 0.011 mm² |
| Σ-Δ DAC filter area | 0.008 mm² (R = 40 kΩ, C = 8 pF) |
| Σ-Δ DAC total area | 0.018 mm² |
| DAC quant. step | 3 mV |

Embodiments of the present invention introduces a new power and silicon area efficient application specific ADC for low-power SMPS that has programmable voltage reference, conversion time, and the accuracy of the output voltage regulation. It can consist of a modified windowed delay-line based ADC and a Σ-Δ DAC. To reduce power consumption and allow on-chip DAC implementation in the latest CMOS technologies, the natural averaging effect of the delay line can be utilized. Then, slow and digitally programmable current starved delay cells can be combined to improve the accuracy of output voltage regulation of conventional delay line based ADC and to reduce its size to a fraction of the original value. The programmable voltage regulation and conversion time can allow further controller optimization, both in terms of size and power consumption. The ADC was implemented on a prototype chip and its characteristics were experimentally verified.

FIG. 7 shows operation of the ADC in closed loop during a 0.2 A to 1 A load transient for $V_{out}$=1.8 V. Complete transient (left) and a reduced time scale around the load change time instance (right). Ch.1: $v_{out}(t)$; Ch.2: voltage across filtering capacitor $v_{ref}(t)$; $d_0$-$d_3$: 4-bit digital error value e[n]; $d_4$: ADC's clock signal at the switching frequency; $d_5$: load transient signal;

FIG. 8 shows stand-alone operation of the ADC around 1.8 V for a triangular input signal; Ch.1: reference $v_{ref}(t)$; Ch.2: input $v_{meas}(t)$; $d_0$-$d_3$: 4-bit error e[n].

FIG. 9 shows a change of the voltage reference (1.6 V to 2 V) Ch.1: reference $v_{ref}(t)$; Ch.2: output voltage $v_{out}(t)$; $d_0$-$d_3$: e[n]; $d_4$: ADC's clock; $d_7$-$d_{14}$ 8 MSBs of $V_{ref}$[n].

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A circuit comprising:
   a sigma-delta DAC that receives a digital value and outputs an analog reference voltage output whose average is related to the digital value; and
   a windowed ADC converter including a reference voltage-to-time converter that is adjusted using the analog reference voltage output of the sigma-delta DAC and a measurement voltage-to-time converter that is adjusted using a system output voltage wherein the windowed ADC converter determines an error value and wherein the reference and the measurement voltage-to-time converters are a moving average filter.

2. The circuit of claim 1, wherein one of the voltage-to-time converters is a delay line.

3. The circuit of claim 1, wherein one of the voltage-to-time converters is a ring oscillator whose supply voltage is changing.

4. The circuit of claim 1, wherein one of the voltage-to-time converters is a conventional voltage controlled oscillator.

5. The circuit of claim 4, wherein a frequency of voltage control oscillator is dynamically changed.

6. The circuit of claim 5, wherein a selectable frequencies of the voltage control oscillator is integer multiples.

7. The circuit of claim 1, wherein the sigma-delta DAC includes an RC filter.

8. The circuit of claim 1 wherein averaging effects of the reference and the measurement voltage-to-time converters are used to minimize a size of on-chip RC filters of sigma-delta based digital to analog converters.

9. The circuit of claim 8, wherein an RC filter corner frequency is selected to be relatively close to the moving average filter notch frequency of the windowed ADC with voltage-to-time converters with averaging effect.

10. The circuit of claim 1, wherein the error indicates a difference of the system output voltage from a digital reference value.

11. The circuit of claim 10, wherein the digital value sent to the sigma-delta DAC is a lower bit or bits of the digital reference value.

12. The circuit of claim 1, wherein the reference voltage-to-time converter is a reference delay line and the measurement voltage-to-time converter is a measurement delay line and wherein a difference in a number of delay cells in the reference delay line and measurement delay line through which a clock passes is used to determine the error.

13. The circuit of claim 12, wherein some of delay cells are programmable to have a programmable delay that is a selectable multiple of the delay of the other delay cells.

14. The circuit of claim 13, wherein the selectable delays are integer multiples.

15. The circuit of claim 14, wherein the integer multiple is selectable to be a integer from 1 to $2^k$.

16. The circuit of claim 15, wherein a total delay of the reference delays line can be selectable over a range of values greater than the number of delay cells.

17. The circuit of claim 1, wherein a general voltage-to-time conversion period is dynamically changed.

18. A circuit comprising:
    a sigma-delta unit; and
    a second unit connected to an output of the sigma-delta unit, the second unit including a reference delay line and measurement delay line wherein an error decoder of the second unit produces an error signal that is derived from a number of delay cells that a clock signal passes through the measurement delay line in a time it takes for the clock signal to pass through a predetermined section of the reference delay line.

19. The circuit of claim 18, wherein the reference delay line is adjusted by a value related to the output of the sigma-delta unit.

20. The circuit of claim 18, wherein the reference delay line and measurement delay line include delay cells that operate at a selectable integer multiple of the delay of other delay cells.

* * * * *